United States Patent
Cok et al.

(10) Patent No.: US 8,063,552 B2
(45) Date of Patent: *Nov. 22, 2011

(54) LED DEVICE HAVING IMPROVED LIGHT OUTPUT

(75) Inventors: Ronald S. Cok, Rochester, NY (US); Joel D. Shore, Rochester, NY (US)

(73) Assignee: Global OLED Technology LLC, Herndon, VA (US)

(*) Notice: Subject to any disclaimer, the term of this patent is extended or adjusted under 35 U.S.C. 154(b) by 505 days.

This patent is subject to a terminal disclaimer.

(21) Appl. No.: 11/876,216

(22) Filed: Oct. 22, 2007

(65) Prior Publication Data

US 2009/0102352 A1 Apr. 23, 2009

(51) Int. Cl.
*H01J 1/62* (2006.01)
*H05B 33/00* (2006.01)
*H01L 51/50* (2006.01)

(52) U.S. Cl. ........... 313/503; 313/504; 313/506; 445/24
(58) Field of Classification Search ........... 313/504–506
See application file for complete search history.

(56) References Cited

U.S. PATENT DOCUMENTS

| | | | |
|---|---|---|---|
| 5,554,911 A | 9/1996 | Nakayama et al. | |
| 5,949,187 A | 9/1999 | Xu et al. | |
| 6,384,529 B2 | 5/2002 | Tang et al. | |
| 6,570,584 B1 | 5/2003 | Cok et al. | |
| 6,680,570 B2 | 1/2004 | Roitman et al. | |
| 6,835,953 B2 * | 12/2004 | Cok et al. | 257/59 |
| 6,861,800 B2 | 3/2005 | Tyan et al. | |
| 6,919,681 B2 | 7/2005 | Cok et al. | |
| 6,987,355 B2 | 1/2006 | Cok | |
| 7,030,553 B2 | 4/2006 | Winters et al. | |
| 7,189,238 B2 | 3/2007 | Lombardo et al. | |
| 7,855,508 B2 * | 12/2010 | Cok et al. | 313/506 |
| 2005/0194896 A1 * | 9/2005 | Sugita et al. | 313/506 |
| 2005/0225232 A1 * | 10/2005 | Boroson et al. | 313/504 |
| 2005/0280362 A1 * | 12/2005 | Shore et al. | 313/506 |
| 2006/0066228 A1 | 3/2006 | Antoniadis et al. | |
| 2006/0232202 A1 * | 10/2006 | Matsuda et al. | 313/506 |
| 2006/0250084 A1 * | 11/2006 | Cok et al. | 313/512 |
| 2007/0102737 A1 * | 5/2007 | Kashiwabara et al. | 257/291 |

FOREIGN PATENT DOCUMENTS

JP 2002278477 A * 9/2002

OTHER PUBLICATIONS

Machine English translation of JP 2002-278477 to Yokogawa et al.*

* cited by examiner

*Primary Examiner* — Sikha Roy
(74) *Attorney, Agent, or Firm* — Morgan, Lewis & Bockius LLP

(57) ABSTRACT

A light-emitting optical cavity light-emitting diode device, comprising:
a) a substrate;
b) a reflective electrode formed over the substrate;
c) an unpatterned light-emitting layer formed over the reflective electrode;
d) a transparent electrode formed over the unpatterned light-emitting layer;
e) one or more different optical spacers, defining at least two different optical path lengths, are formed in different locations over the substrate, between the reflective electrode and the transparent electrode; and
f) a low-index layer formed over the transparent electrode.

19 Claims, 13 Drawing Sheets

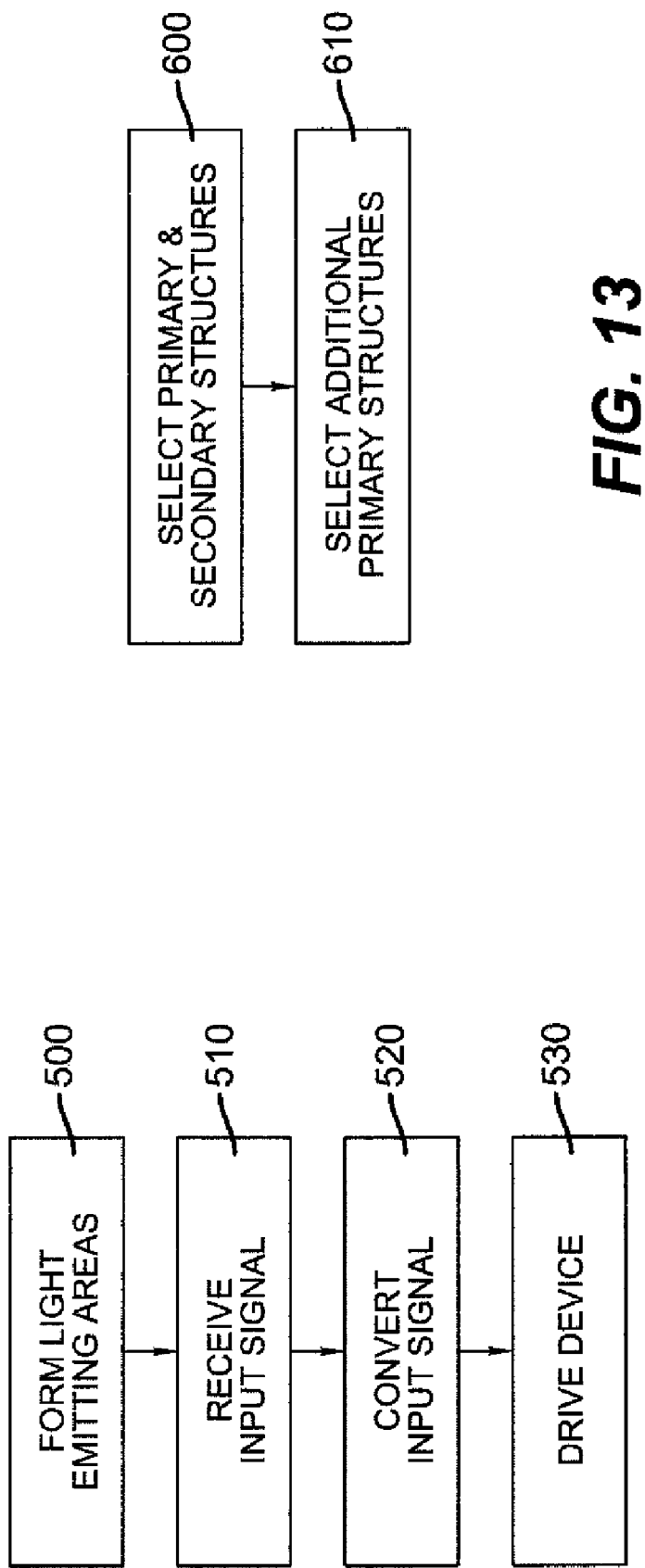

LED DEVICE HAVING IMPROVED LIGHT OUTPUT

FIELD OF THE INVENTION

The present invention relates to light-emitting diode (LED) devices, and more particularly, to LED device structures for improving light output efficiency.

BACKGROUND OF THE INVENTION

Emissive flat-panel display devices are widely used in conjunction with computing devices and in particular with portable devices. These displays are often used in public areas with significant ambient illumination and are viewed from a wide variety of angles.

Light emitting diodes (LED) incorporating thin films of light-emitting materials have many advantages in a flat-panel display device and are useful in optical systems. U.S. Pat. No. 6,384,529 issued May 7, 2002 to Tang et al. shows an OLED color display that includes an array of organic LED light-emitting elements (pixels). Light is emitted from a pixel when a current is passed through an organic material, the frequency of the light emitted is dependent on the nature of the organic material used. The organic materials are placed upon a substrate between electrodes, with an encapsulating cover layer or plate. In such a display, light can be emitted through the substrate (a bottom emitter) or through the encapsulating cover (a top emitter), or both. The emitted light is Lambertian, that is it is emitted equally in every direction. Because LED devices employ high-optical-index emissive materials, a large fraction (e.g. greater than 50%) of the emitted light is trapped in the device due to total internal reflection and thus reduces the device efficiency. Inorganic materials, for example, may include phosphorescent crystals or quantum dots. Other thin films of organic or inorganic materials can also be employed to control charge injection, transport, or blocking to the light-emitting-thin-film materials, and are known in the art.

Optical cavity structures are known to increase the light emitted from an OLED device structure. Such optical cavity structures are also known as microcavities or optical microcavities when formed in thin films. When formed in LED devices, different color light-emitting organic materials are pattern-wise deposited over a substrate between a reflective electrode and a transparent electrode. Light emitters having different colors are thus formed within an optical cavity tuned to a desired peak wavelength of light, typically corresponding to the color of light emitted by the patterned organic materials. U.S. Pat. No. 6,680,570 describes an organic light-emitting device with improved color control employing spacer layers to form an optical cavity. FIG. 9 illustrates such a prior-art, active-matrix, bottom-emitting optical cavity device employing a substrate 10 with active-matrix thin-film components 30, planarization structures 32 and 34, and a semi-transparent electrode 17. Patterned organic materials 14R, 14G, and 14B, providing red, green, and blue light emission, are deposited in a light-emitting layer. Optical spacers 26R, 26G, and 26B are employed to form optical cavities 90, 92, and 94 between reflective and semi-transparent electrodes 12, 17 respectively tuned to the desired peak wavelengths of red, green, and blue light, respectively to emit red light 80, green light 82, and blue light 84. A cover 20 can be employed to protect and encapsulate the device. While such designs are useful, they require a patterned organic material deposition technology (for example, vacuum deposition through metal shadow-masks) that is difficult to scale to large substrates. Moreover, optical cavity devices typically suffer from an unacceptable angular color dependence. It is also known to employ a color filter with an optical cavity structure, for example, as taught in U.S. Pat. No. 7,189,238. However, while useful, such an approach does not improve the manufacturability of the device and provides inadequate ambient contrast ratio under some illumination conditions. Moreover, the color filters absorb light emitted from the light-emitting layer, thereby reducing device efficiency.

U.S. Pat. No. 5,554,911 entitled "Light-emitting elements" describes a multi-color light-emitting element having at least two optical cavity structures with respectively different optical lengths determining their emission wavelengths. Each optical cavity structure includes an organic material as a light-emitting region, which may be a single film of uniform thickness in the element. U.S. Pat. No. 6,861,800 entitled, "Tuned microcavity color OLED display" describes a microcavity OLED device having an array of pixels divided into at least two different color pixel sets, each color pixel set emitting a different predetermined color light over a common substrate, wherein each pixel in the array includes a metallic bottom-electrode layer disposed over the substrate and a metallic electrode layer spaced from the metallic bottom-electrode layer. The material for the semi-transparent metallic electrode layer includes Ag, Au, or alloys thereof. The thickness of the semi-transparent metallic electrode layer, the combined thickness of the organic layers and the transparent conductive phase-layer, and also the placement of the light-emitting layer are selected so that each pixel in the display forms a tuned microcavity OLED device having emission output efficiency above that of a comparable OLED device without the microcavity. U.S. Pat. No. 5,949,187 describes an OLED with a first microcavity, including a first transparent spacer and a first mirror stack positioned on the first spacer to reflect light back into the OLED and to define an optical length of the first microcavity. The optical length of the first microcavity is such that light emitted from the first microcavity has a first spectrum. A second microcavity includes a second transparent spacer positioned adjacent the first microcavity and a second mirror stack positioned on the second spacer reflects light toward the second OLED and defines an optical length of the second microcavity. The optical length of the second microcavity is such that light emitted from the second microcavity has a second spectrum. Additional microcavities can be placed in the structure to further enhance and alter the light spectrum. Such designs, however, may have increased manufacturing costs, lower light output than desired, and reflectance larger than may be desired, as well as significant color change at different viewing angles, owing to the change in the effective optical path length for light traveling at angles to the normal.

US 2006/0066228 A1 entitled, "Reducing or eliminating color change for microcavity OLED devices", by Antoniadis discloses a microcavity OLED device that minimizes or eliminates color change at different viewing angles. The OLED device can be, for example, an OLED display or an OLED light source used for area illumination. This OLED device includes a multi-layer mirror on a substrate, and each of the layers is comprised of a non-absorbing material. The OLED device also includes a first electrode on the multi-layered first mirror, and the first electrode is substantially transparent. An emissive layer is on the first electrode. A second electrode is on the emissive layer, and the second electrode is substantially reflective and functions as a mirror. The multi-layer mirror and the second electrode form a microcavity. On a front surface of the substrate is a light modulation thin film. The light modulation thin film can be any one of: a cut-off color filter, a band-pass color filter, a brightness enhancing film, a microstructure that attenuates an emission spectrum at an angle at which there is a perceived color change, or a microstructure that redistributes wavelengths so the outputted emission spectrums have the same perceived color. Again such designs may have increased manufacturing costs due to patterned deposition processes. Also, significant light can be absorbed by the color filters thereby, reducing efficiency.

One approach to overcoming material deposition problems on large substrates is to employ a single emissive layer, for example, a white-light emitter, together with color filters for forming a full-color display, as is taught in U.S. Pat. No. 6,987,355 entitled "Stacked OLED Display having Improved Efficiency" by Cok. However, the use of color filters substantially reduces the efficiency of the device. It is also known to employ a white sub-pixel that does not include a color filter, for example, as taught in U.S. Pat. No. 6,919,681 entitled, "Color OLED Display with Improved Power Efficiency" by Cok et al. However, this disclosure does not address angular color issues or the large amount of trapped light.

U.S. Pat. No. 7,030,553 entitled, "OLED device having microcavity gamut sub-pixels and a within gamut sub-pixel" by Winters et al, discloses an example of a prior-art microcavity device. This disclosure describes an OLED device including an array of light-emitting pixels, each pixel including sub-pixels having organic layers including at least one emissive layer that produces light and spaced electrodes. There are at least three gamut sub-pixels that produce colors that define a color gamut and at least one sub-pixel that produces light within the color gamut produced by the gamut sub-pixels. At least one of the gamut sub-pixels includes a reflector and a semitransparent reflector, which function to form a microcavity. However, this design employs a patterned semitransparent electrode that can be difficult to manufacture in a top-emitting format. Moreover, angular color change is not addressed. U.S. Pat. No. 6,570,584 entitled "Broad Color Gamut Display" by Cok et al describes a digital color image display device, including a plurality of pixels, each pixel having a plurality of sub-pixels with at least one of the sub-pixels producing a color other than red, green, or blue. However, there is no teaching of improving device efficiency or addressing angular color issues.

There still remains a need, therefore, for an improved light-emitting structure that overcomes shortcomings in the prior art and that increases the light output and angular color performance of an LED device, such as a display.

SUMMARY OF THE INVENTION

The need is met in one embodiment of the present invention with a light-emitting diode device, comprising:

a) a substrate;

b) a reflective electrode formed over the substrate;

c) an unpatterned light-emitting layer formed over the reflective electrode;

d) a transparent electrode formed over the unpatterned light-emitting layer;

e) one or more different optical spacers, defining at least two different optical path lengths, formed in different locations over the substrate, between the reflective electrode and the transparent electrode; and f) a low-index layer formed over the transparent electrode.

ADVANTAGES

The present invention has the advantage that it increases the light output and reduces any angular color change of an LED device.

BRIEF DESCRIPTION OF THE DRAWINGS

FIG. 12 is a flow diagram according to a method of the present invention; and

FIG. 13 is a flow diagram according to a method of the present invention.

It will be understood that the figures are not to scale since the individual layers are too thin and the thickness differences of various layers too great to permit depiction to scale.

DETAILED DESCRIPTION OF THE INVENTION

Figure 1A:
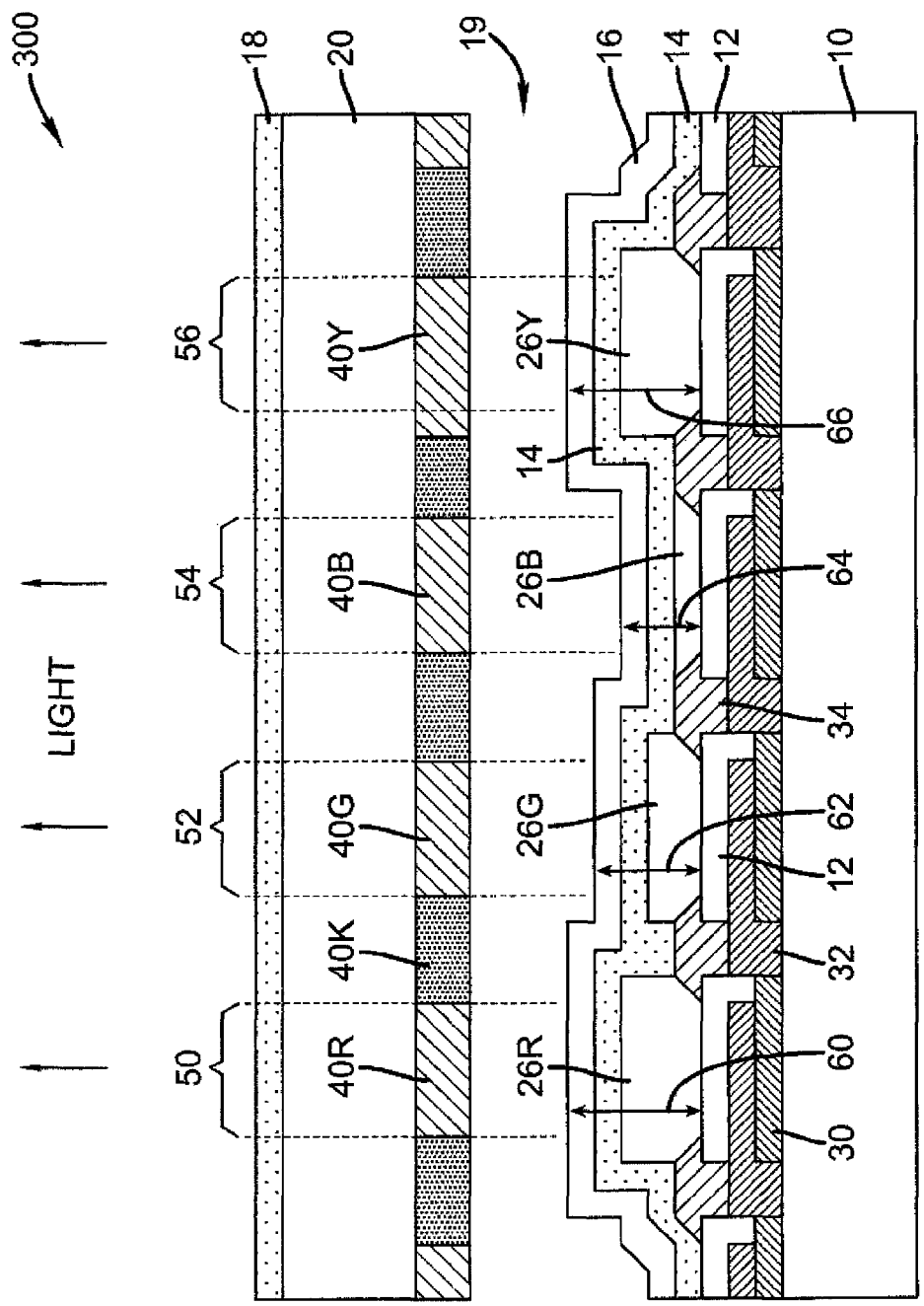
FIGS. 1A and 1B illustrate partial cross sections of a top-emitter LED device according to various embodiments of the present invention.
Figure 1B:
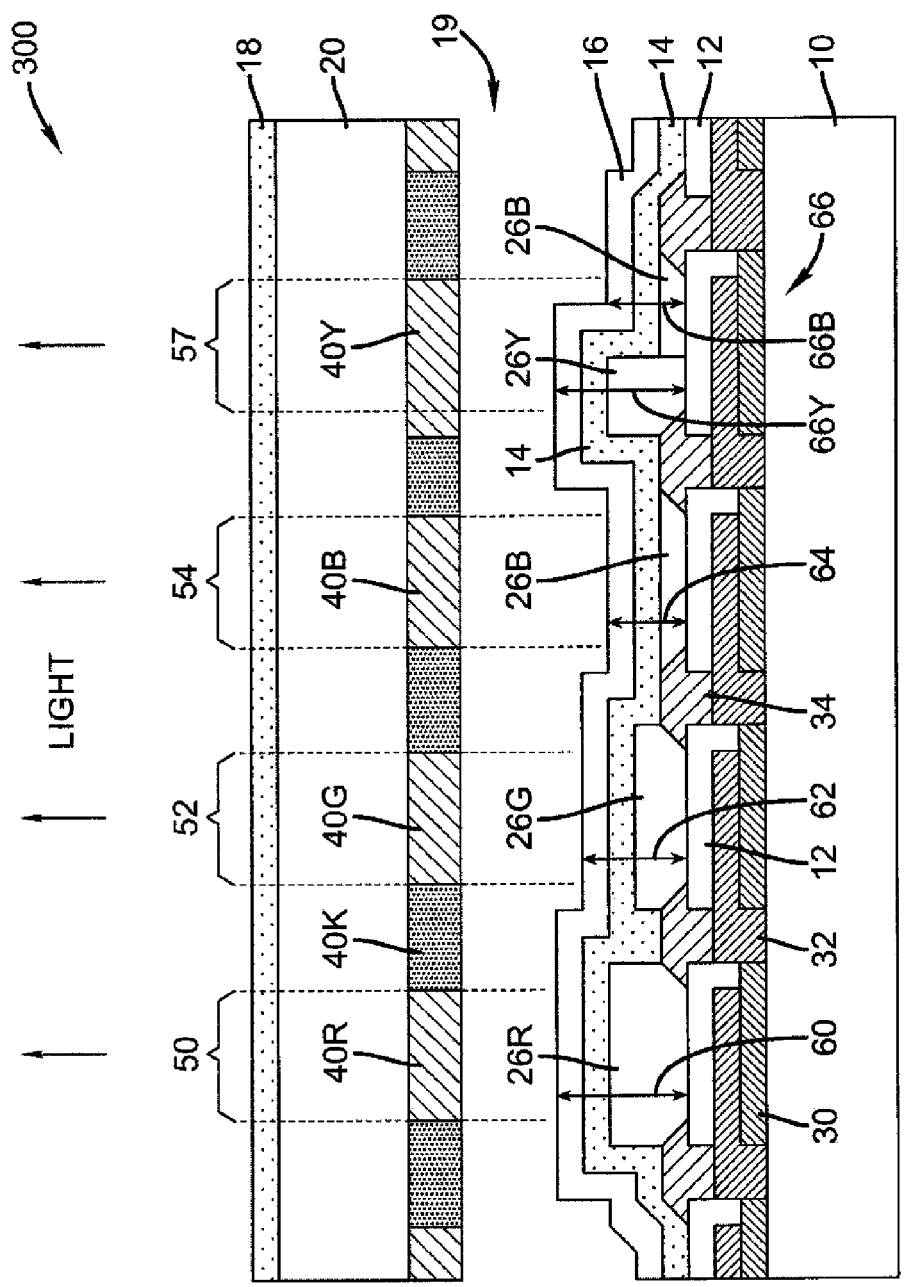

Referring to FIGS. 1A and 1B, an exemplary embodiment of a light-emitting diode device according to the present invention comprises a substrate 10, a reflective electrode 12 formed over the substrate 10, and a transparent electrode 16 formed over the reflective electrode 12. Either the reflective electrodes 12 or transparent electrodes 16 are patterned to form a plurality of light-emitting areas in different locations over the substrate. Each light-emitting area can be independently controllable to form a sub-pixel (e.g. 50 in FIG. 1A) or two or more light-emitting areas can be controlled together to form a sub-pixel (e.g. 57 in FIG. 1B). As shown in FIGS. 1A and 1B, for example, reflective electrode 12 is patterned. The sub-pixels can be controlled, for example by thin-film electronic components 30 formed on the substrate 10. The other electrode (e.g. 16) can be unpatterned and electrically common to all of the light-emitting sub-pixels 50, 52, 54, and 56. Within a sub-pixel, the transparent electrode 16 is not patterned. An unpatterned light-emitting layer 14 is formed between the reflective electrode 12 and the transparent electrode 16 and can comprise several layers, for example, light-emitting layers and charge-control layers. In one embodiment, the light-emitting layer 14 emits white light. A low-index layer 19 is formed over the transparent electrode 16 and forms a low-index gap between the transparent electrode 16 and a cover 20 or any color filters or black matrix material. As used herein, low-index means that the optical index of the low-index layer 19 is less than that of the transparent electrode, any color filters or cover and, preferably, less than 1.4 and more preferably less than 1.1.

Because of Fresnel reflections at the interface between the transparent electrode 16 and low-index layer 19, the reflective electrode 12, transparent electrode 16, low-index layer 19, and unpatterned, light-emitting layer 14 in combination cause constructive and destructive optical interference patterns. While these optical effects are much weaker than those of a conventional, prior-art microcavity, they nonetheless advantageously modify the optical behavior of the LED device of the present invention as discussed below. Different optical spacers 26R, 26G, 26B, 26Y are formed over the substrate 10 in different locations and have different optical path lengths 60, 62, 64, and 66. At least one, and fewer than all, of the sub-pixels 50, 52, 54, 56 can emit light through a color filter. At least one color filter 40R, 40G, or 40B can be formed over a side of the transparent electrode 16, opposite the unpatterned light-emitting layer 14, in correspondence with the sub-pixels 50, 52, 54 to form colored sub-pixels. Typically, the color filters have at least two different colors.

Referring to FIG. 1A, the light-emitting areas can be coincident with independently-controllable light-emitting sub-pixel elements 50, 52, 54, and 56. Alternatively, referring to FIG. 1B, one or more of the sub-pixel elements can comprise two or more light-emitting areas having different optical spacers 26Y, 26B providing different optical path lengths 66Y and 66B for sub-pixel 57.

In one exemplary embodiment, a first sub-pixel (e.g. 54) emits light having a first primary color (e.g. blue) and a second sub-pixel (e.g. 56) emits a light of a complementary color to the primary color (e.g. yellow); the light from the first and second sub-pixels changing at different angles. The color of the combined light of the first and second sub-pixels changes less at different angles than the light from at least one of the first or second sub-pixels. Hence, at least one optical spacer in one light-emitting area forms an optically constructive interference pattern at a frequency corresponding to a primary color frequency and least one other optical spacer in another light-emitting area forms an optically constructive interference pattern at a frequency corresponding to a frequency of a color complementary to the primary color frequency. A third sub-pixel (e.g. 50 or 52) emits light of a second primary color (e.g. red) different from the first primary color. The third sub-pixel emits light through a color filter (e.g. 40R). Alternatively, two different light-emitting areas in one sub-pixel (e.g. 57) emit a primary color and a complementary color (e.g. blue and yellow) that, when combined, can be substantially white. The color of the combined light of the two light-emitting areas changes less at different angles than the light from at least one of the light-emitting areas.

In various embodiments of the present invention, the two different complementary frequencies are blue and yellow or red and cyan. Alternatively, two or more different spacers in two different light-emitting areas form optically constructive interference patterns at two different wavelengths that differ by less than 150 nm.

In one particular embodiment, the light-emitting layer 14 emits white light. Since the light-emitting layer 14 is unpatterned, the white light can be employed to create primary and secondary colors with the use of appropriate color filters and the Fresnel reflections in combination with properly-tuned optical cavity structures. Primary color sub-pixels can include red, green, and blue colored light emitters. Color filters can be employed to improve the purity of the emission from the primary color sub-pixels. Another sub-pixel (preferably unfiltered) can be employed to emit white light, or a color complementary to one of the primaries (e.g. yellow, cyan, or magenta). The white light can have a spectrum with frequency peaks and an optical spacer in a light-emitting area can form an optically constructive interference pattern at a frequency corresponding to a spectral frequency peak of the white light, thereby improving the emission efficiency of the device. In another embodiment, a white-light emitting sub-pixel can have two (or more) separate light-emitting areas with different optical spacings to emit complementary colors that are, together, perceived as substantially white. For example, blue and yellow can be combined to form a substantially white light as can red and cyan. In yet another embodiment of the present invention, three colors are employed, for example, red, yellow, and blue. Applicants have found through experimentation that, as the viewing angles increase, the red light tends toward yellow, the yellow light tends toward green, and the blue light tends toward violet the combination of the colors at a variety of viewing angles can maintain a substantially white color as perceived by the human viewer at the variety of viewing angles. The exact ratio of the three colors depends on the spectrum of the light emitted from the unpatterned light-emitting layer and can be selected by modeling the optical path lengths and selecting preferred optical spacers. For one embodiment, a first light-emitting area emits red light, a second light-emitting area emits green light, a third light-emitting area emits blue light, and at least one fourth light-emitting area emits white or colored light with a luminous efficiency higher than that of least one of the red, green, and blue light-emitting area. Hence, by employing a fourth, higher efficiency, unfiltered sub-pixel to complement the three primary color sub-pixels, the device can have improved luminous efficiency.

In an embodiment of particular interest, the red and green sub-pixels include corresponding color filters, while the blue does not include a color filter. The fourth sub-pixel is then white or yellow and may not include a color filter, although a yellow color filter can be useful, as described below. This configuration is particularly interesting, because the white or yellow emitter can be very efficient, particularly in a small-molecule organic light-emissive layer.

The present invention employs Fresnel reflections to enhance the output of high-optical index, thin films of light-emitting materials at a normal to the light-emitting layer 14. Such thin-films exhibit a strong color dependence on angle. Hence, color filters can be provided to reduce the color angular dependence, at the cost of luminance angular dependence. Unfortunately, it can also be the case that blue emitters (particularly for organic materials) are very inefficient. One approach to overcoming the inefficiency of blue emitters is to employ a fourth, more-efficient white sub-pixel in a full-color pixel to emit unsaturated light. Such light is prevalent in most images. An alternative approach is to employ a yellow sub-pixel that is more efficient than the blue sub-pixel as the fourth sub-pixel. However, as demonstrated by applicants, such white or yellow sub-pixels vary significantly in their color as viewing angle changes. While the addition of color filters (at least for the yellow case) can reduce the angular changes, such a color filter reduces the efficiency of the fourth emitter, and thereby the reason for including the fourth sub-pixel. Hence, in prior-art designs employing microcavities, either inefficient emitters are employed, or an unacceptably strong angular variation is prevalent, or inefficient color filters are used in combination with a fourth emitter. Moreover, prior-art microcavity designs require patterned emitters or a patterned transparent electrode, both of which greatly increase manufacturing costs.

By employing an unpatterned light emitting layer (e.g. a white-light-emitting layer or layers) and an unpatterned transparent electrode 16 and low-index layer 19 with patterned optical spacing elements to form a variety of optical structures that emit in combination a primary color and a complementary color, more efficient, unpatterned materials can be used, angular color change mitigated, and efficient light output achieved. Each of the optical structures emits colored light due to constructive interference within the various optical cavities. However, applicants have demonstrated that, when an unpatterned white-light emitting layer is employed, red and green colors are insufficiently saturated to provide a good color gamut in most cases, while the blue emitter can be acceptable. All of the sub-pixels (without a color filter) exhibit significant color dependence on angle. This is mitigated (for white-light emission) by combining the emission of complementary-color-light-emitting sub-pixels or light-emitting areas within one sub-pixel. In particular, a blue first sub-pixel without a color filter, a complementary yellow sub-pixel without a color filter, and red and green sub-pixels with color filters can be employed. Alternatively, a blue sub-pixel with or without a color filter, a white-light emitting sub-pixel without a color filter, and red and green sub-pixels with color filters can be employed. As discussed in more detail below, the red and green emitters efficiently emit light and the angular color variation is controlled by the corresponding color filters. The blue sub-pixel can be more efficient, if it does not include a color filter; and while some angular color change is observed, the angular color change may be acceptable. The white or yellow sub-pixel typically has greater efficiency compared to the blue and red emitters (when derived from an unpatterned white-light-emitting layer and especially when a color filter is not used) and is employed (in combination with the blue sub-pixel in the case of a yellow, fourth sub-pixel) to emit apparently white light when forming unsaturated colors. Moreover, the angular color change that occurs for each of the blue and yellow emitters (in the absence of color filters that reduce efficiency), when combined, reduces the angular color change of the apparently white light. Hence, an efficient, full-color system with reduced angular color change is provided. Although, the color combinations described above can be employed in one exemplary embodiment, alternative color combinations can also be employed.

Notably, a pixel is a multi-color picture element comprising three or more sub-pixels, each sub-pixel includes an independently-controlled light emitter emitting light of a different color. Typically, pixels include red, green, and blue sub-pixels (an RGB configuration). In addition, as employed in this disclosure, a complementary-color, independently-controllable sub-pixel is also included in each pixel (e.g. a yellow emitter in an RGBY configuration). For a yellow sub-pixel in an RGBY configuration with great luminous efficacy than at least one of the red, green, or blue sub-pixels, (as will generally be true due to the lack of a color filter over the yellow sub-pixel and a more efficient emitter), increased brightness or reduced power utilization is obtained for images containing regions having low-to-moderate color saturation (i.e. having a significant gray component). Alternatively, when a white sub-pixel is employed having two complementary light-emitting areas in an RGBW configuration, if the white sub-pixel has a greater luminous efficacy than at least one of the red, green, or blue sub-pixels (as will generally be true due to the lack of a color filter over the white sub-pixel and at least one more efficient emitter such as a yellow emitter) increased brightness or reduced power utilization is obtained for images containing regions having low-to-moderate color saturation (i.e. having a significant gray component). The light-emitting elements 50, 52, 54, 56, and 57 correspond to sub-pixels.

The present invention thus can alternatively employ an RGBY (red, green, blue, and yellow) sub-pixel or RGBW (red, green, blue, and white) sub-pixel architecture to form individual pixels in an information presentation device, such as a display. A common, unpatterned white-light emitter 14 can be employed. Colored light is formed by a combination of separately tuned optical structures for each color together with color filters 40R, 40G (for the color sub-pixels). A black matrix 40K can be employed to absorb ambient light between the light-emitting sub-pixel elements 50, 52, 54, 56. Planarizing and insulating layers 32 and 34 can be provided to electrically separate the independently-controllable light-emitting sub-pixel elements. Color filters may not be necessary for all of the primary sub-pixels and any complementary or white sub-pixels, but one or the other may employ a color filter (e.g. either 40B or 40Y but not both).

According to some embodiments, the complementary-color sub-pixel emitter can be more efficient than at least one of the colored sub-pixels. Furthermore, one or both of a complementary pair of light emitters can be more efficient than at least one of the colored primary sub-pixels. The emission can be more efficient in comparison to the colored sub-pixels even if the colored sub-pixels did not include a color filter. It is desirable, however, that a white color formed by the complementary pair of light-emitting areas (e.g. blue and yellow) be higher in luminance efficiency than the same white color when formed by the three primary display colors (e.g. red, green, and blue). The efficiency of the common, unpatterned white emitter is defined in terms of either radiant or luminous efficiency.

Figure 2:
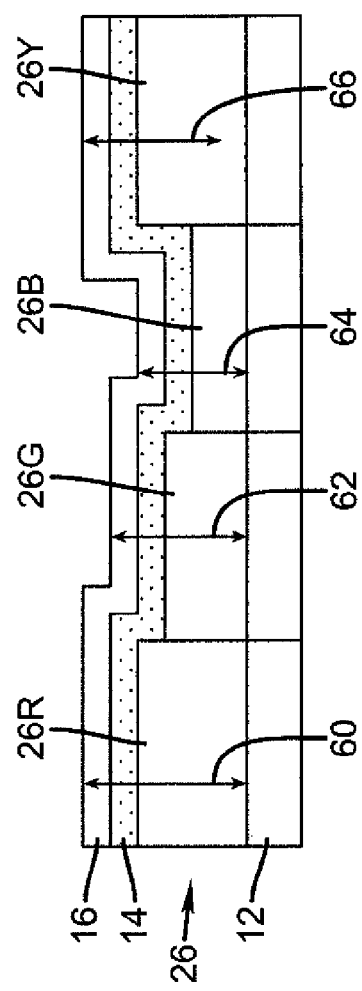
FIG. 2 illustrates a more detailed, partial cross section of a top-emitter LED device shown in FIG. 1A according to an embodiment of the present invention.
Figure 3:
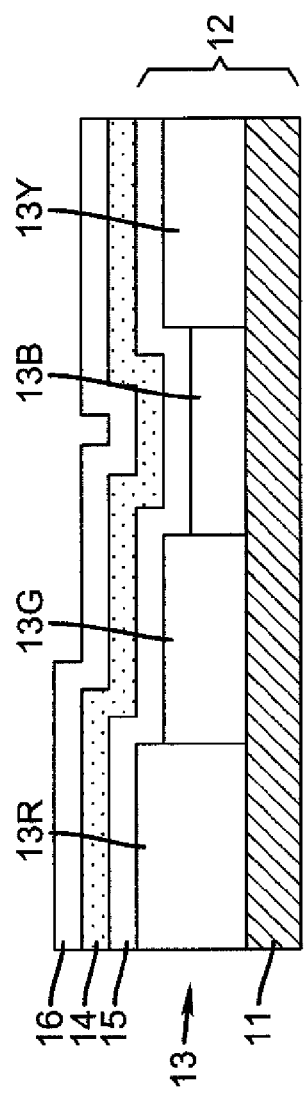
FIG. 3 illustrates optical spacers useful with various embodiments of the present invention.

Referring to FIG. 2, in a more detailed drawing of a portion of FIG. 1A, a reflective electrode 12 is formed over a substrate (not shown) together with optical spacers 26 for tuning optical cavities. The optical spacers 26 can be electrically conductive (e.g. comprising indium tin oxide or aluminum-doped zinc oxide). Each of the optical path lengths 60, 62, 64, 66 is tuned with corresponding optical spacers 26R, 26G, 26B, 26Y tuned, for example, to red, green, blue, and yellow, respectively. As shown in FIG. 1, the present invention employs optical spacer layers 26R, 26G, 26B, and 26Y having different thicknesses between the reflective electrode 12 and the light-emissive layer 14. In an alternative embodiment of the present invention, shown in FIG. 3, the optical cavity structures can be tuned by employing transparent spacer layers 13R, 13G, 13B, 13Y between a reflective layer 11 and a transparent conductive layer 15, the reflective layer 11 and transparent conductive layer 15 comprising the reflective electrode 12. In other embodiments, (not shown) spacer layers can be located in other positions, for example, between the light-emissive layer 14 and the transparent electrode 16. In all of these exemplary embodiments, a reflective layer and a conductive layer together comprise the reflective electrode, whether or not the reflective layer and the conductive layer are the same layer, adjacent layers, or are separated by spacer layers. The optical spacers 13 are electrically conductive (for example when formed from indium tin oxide) and the layers 13 and 15 are a single layer.

In this disclosure, complementary wavelengths of light are those wavelengths of light that, when viewed together, form a substantially white-appearing light such as light on or near the Planckian locus. For example, blue and yellow form a complementary pair, as do cyan and red and magenta and green. According to various exemplary embodiments herein, the sub-pixels can form pixels in a display wherein the sub-pixels are not individually distinguished by eye at a design viewing distance. Hence, the light emitted from the primary and complementary sub-pixels (e.g. 54, 56 in FIG. 1) will be viewed as white by a typical human eye, even though the light emitted is actually a combination of complementary colors. A transparent electrode is an electrically conductive layer that is substantially transparent, for example with a transparency greater than 70%, preferably greater than 80%, and even more preferably greater than 90%. For example, layers of indium tin oxide (ITO) or aluminum-doped zinc oxide (AZO) can be employed having a thickness, for example, of 100 nm.

In operation, current, as supplied through thin-film transistors 30, passes through the light-emitting layer 14 via the electrodes 12 and 16, causing light to be emitted. Some of the emitted light passes directly out of the device or through the color filters and out of the device. Other light is reflected from the reflective electrode 12 and passes out of the device. Yet other light is reflected via Fresnel reflection from the interface between the transparent electrode 16 and the low-index layer 19 to form optically constructive and destructive interference patterns. Some light, emitted at a higher angle to the normal, is trapped via total internal reflection. The optically constructive and destructive interference effects serve to reduce the angle of emission of the emitted light, thereby reducing the amount of trapped light and also focusing more of the desired light in the forward direction. The present invention can be employed with both active-matrix and passive-matrix control circuits.

In particular, the present invention provides a means to form a substantially white light that is viewed as white at a variety of angles from the normal. The light output from the complementary light-emitting areas increases in frequency (and decreases in wavelength) as the angle at which the light is emitted increases from the normal (90 degrees) with respect to the substrate. Since white emitters are inherently broadband, a general shift in a broad range of frequencies is seen at higher angles to the normal. In addition, the human visual system is most sensitive to green and, therefore, such a device will typically take on a yellow, green, or cyan appearance when viewed at angles greater than zero (0) degrees from a normal to the reflective electrode.

However, according to one embodiment of the present invention, mutually-compensating optical structures are employed to form a white-light-emitting element from two or more different optical structures, which individually emit light that exhibits significant color saturation and has a narrower bandwidth than the white-light emitters alone. The different optical structures of the complementary light-emitting areas can mutually compensate for the shift in the output frequency that occurs in each of the individual light-emitting areas when they are viewed at an angle greater than 0 degrees from the normal. More precisely, the wavelength or efficiency of the light emitted from each of the complementary light-emitting areas will change at different viewing angles, but in a complementary fashion such that the white-point of the combined light emission from the complementary light-emitting areas will undergo a relatively small change as compared to the color change of the individual light-emitting areas, or the other primary sub-pixels.

Figure 4:
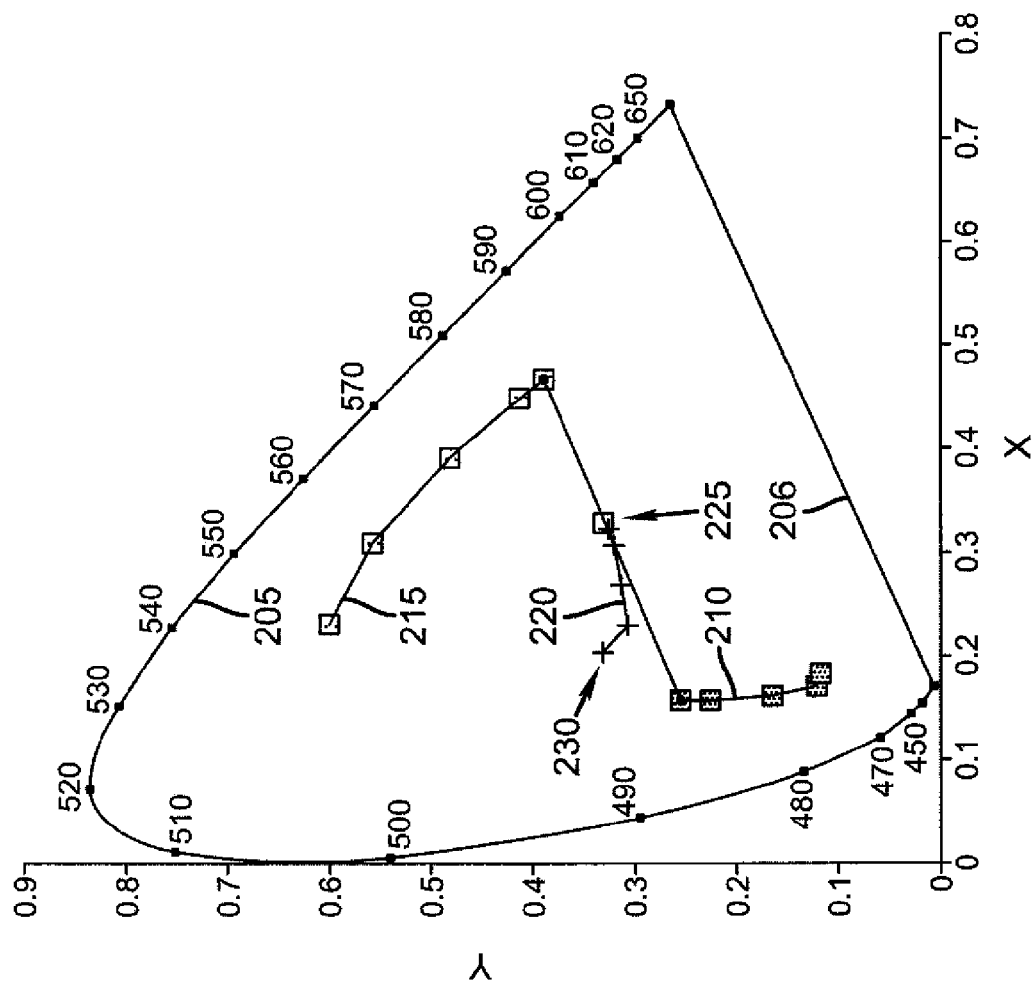
FIG. 4 is a graph illustrating the light emission wavelengths in CIE x and CIE y space of various embodiments of the present invention.

Referring to FIG. 4, a CIE 1931 x,y chromaticity diagram is shown with a spectrum locus 205 illustrating the position of monochromatic light sources, and a combining red and blue light boundary 206. The area enclosed by the spectrum locus 205 and the red and blue boundary 206 includes all visible colors. The light emission 210 of a cyan/blue-emitting optical structure (e.g. from optical path length 64) is shown at a plurality of increasing angles with respect to the substrate's normal, beginning at the normal with (x,y) coordinates of (0.160, 0.253) and ending at 60 degrees with (x,y) coordinates of (0.186, 0.116). In particular, note that as the viewing angle of the optical cavity increases, the perceived color of the light becomes bluer, with a higher frequency and shorter wavelength. Likewise, the CIE coordinates 215 of a yellow/green-emitting optical cavity (e.g. from optical path length 66) is shown at a several angles. Again, as the viewing angle of the optical structure increases, the perceived color of the light shifts to a higher frequency and shorter wavelength (in this case becoming greener), beginning at (x,y) coordinates of (0.469, 0.389) and ending at (x,y) coordinates of (0.233, 0.598). Although the light emitted from the primary and complementary sub-pixels is colored, the combined light appears to be white since the colors are complementary, having CIE 1931 chromaticity coordinates of (0.267, 0.300) when viewed at 0 degrees viewing angle and (0.1987, 0.246) when viewed at an angle of 60 degrees, and shown as CIE coordinates 220. As the angle of view changes, both the blue and yellow emitters change color significantly. However, the combined color stays relatively constant and substantially white. Point 225 illustrates the white point at a normal angle relative to the substrate and point 230 illustrates the white point at a 60-degree angle relative to the substrate normal. These curves are taken from a real, white-light OLED device made by applicants with the change in color at different angles determined using optical modeling. However, the degree to which the color changes with respect to angle will depend upon the strength of the Fresnel reflections that is, in turn, dependent upon the relative optical indices of the low-index layer 19 and the transparent electrode 16. FIGS. 4, 6B and 6C are illustrative of a very strong reflection to clearly demonstrate the color-compensation effect.

Figure 5:
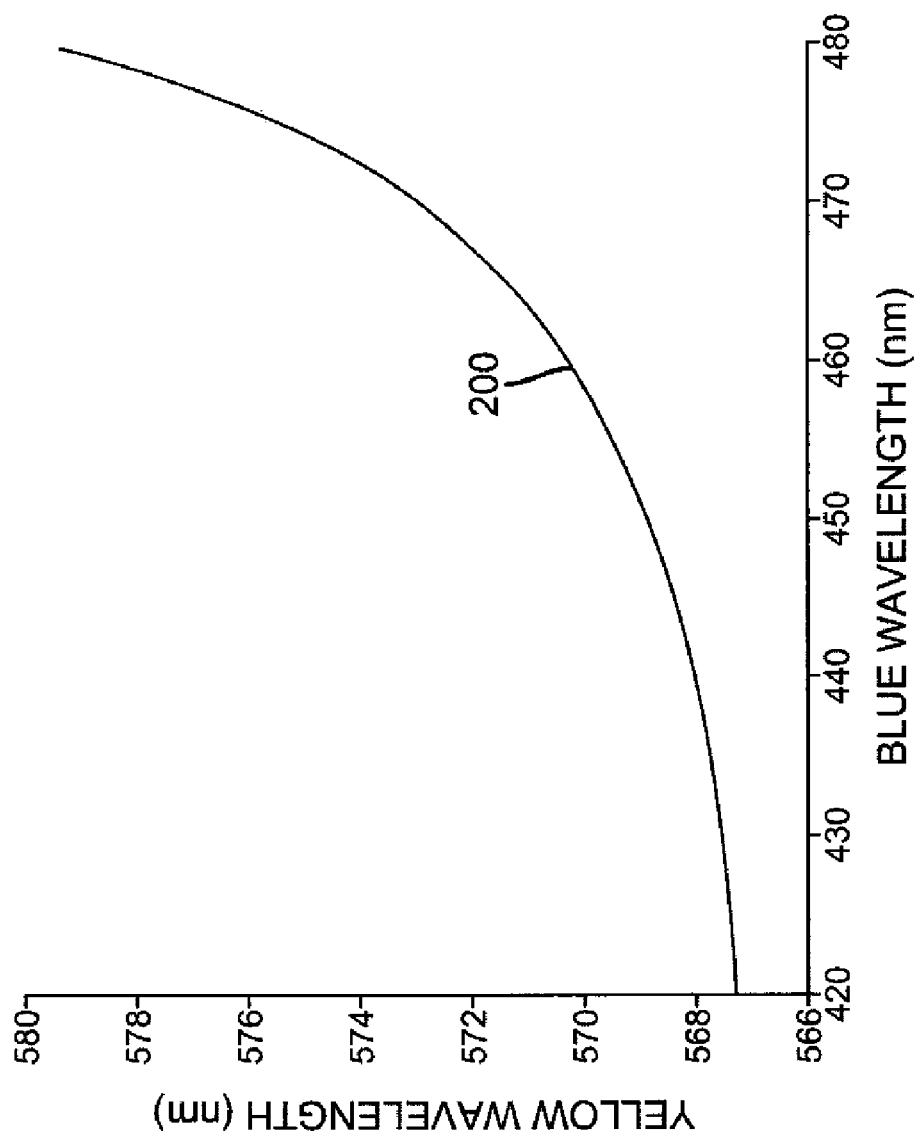
FIG. 5 is a graph illustrating the constant D65 light output for various yellow and blue frequency combinations useful in understanding various embodiments of the present invention.

As can be seen from this graph, the chromaticity coordinates of the white change little in the y dimension, while a somewhat larger change is seen in the x dimension. However, the overall change is smaller than that of either of the blue or yellow emitters and the color remains substantially white. FIG. 5 shows a curve 200 that relates the combined monochromatic blue and yellow wavelengths that produce a constant D65 white point using these two complementary colors. As can be seen from this graph, a greater change in the blue wavelength is required to offset a smaller change in the yellow wavelength to maintain the white point. Further, experiments conducted by the applicants have shown that observers are more tolerant of color shifts in white or neutrals towards the blue direction than towards the yellow direction. The emitters shown in FIG. 4 take advantage of these effects by balancing the blue-yellow contributions to minimize the shift in the yellow direction, while permitting some deviation in the blue direction. This change can be physically controlled by employing a color filter over the complementary light-emitting area that preferentially transmits light emitted at a normal angle with respect to the substrate and preferentially absorbs light emitted at an angle other than the normal. For example, a filter (40Y in FIGS. 1A and 1B) can be employed over the yellow-light-emitting area. The color filter absorbs greenish light having a wavelength less than, for example, 570 nm, 560 nm, or 550 nm. This will have the effect of limiting the movement of the white point or, equivalently, increasing the relative impact of the blue sub-pixel. In alternative embodiments and as modeled by the applicants, a filter (e.g. 40B in FIGS. 1A and 1B) that absorbs deep blue-violet light having a wavelength less than, for example, 500 nm, 490 nm, or 480 nm can be employed to limit white-point movement in the opposite direction.

A large variety of white-light-emitting materials can be employed in concert with the present invention, together with a wide selection of optical cavity sizes, both for the primary colored sub-pixels 50, 52, 54, and the complementary sub-pixel 56 or white sub-pixel 57. In one embodiment of the present invention, the complementary or white sub-pixel 56 or 57 emits substantially yellow, orange, or red light at a normal angle with respect to the substrate and can include a color filter. In particular, the complementary sub-pixel can be tuned to emit light having a peak wavelength longer than 550 nm at a normal angle and can include a color filter formed over the complementary light-emitting area, the color filter absorbing a substantial amount of the light having a wavelength shorter than 550 nm.

A variety of white-light emitters can be employed with the present invention and a variety of optical structures can be formed to create white light-emitting elements from these white-light emitters. In some embodiments, the light-emitting layer 14 includes materials for emitting light having at least two emission peaks (e.g. a primary color and a color complementary to the primary color such as blue and yellow). These emission peaks can be located at frequencies that correspond to the desired colors of light emitted by the first and second sub-pixels to optimize emission efficiency. Likewise, the optical cavities can be tuned to the same frequencies as can the color filters, where present. In alternative embodiments, the light-emitting layer 14 includes materials for emitting light having at least three emission peaks and the emission peaks are located at frequencies that correspond to the primary colors used by the device. In yet other alternative embodiments of the present invention, the light-emitting layer 14 contains materials for emitting light having at least four emission peaks and the emission peaks are located at frequencies that correspond to the colors of light emitted by the primary color and complementary color light-emitting areas. In these various embodiments, it is generally the case that multi-peak, broad-band emission is perceived as substantially white light and the unpatterned, light-emitting layer 14 is a white-light-emitting layer.

In various specific embodiments, the light-emitting diode device employs a first optical cavity for a first sub-pixel that is tuned to emit red light, a second optical cavity for a second sub-pixel that is tuned to emit green light, a third optical cavity for the third sub-pixel that is tuned to emit blue light and the fourth optical cavity of the fourth sub-pixel is tuned to emit yellow light or includes two light-emitting areas that are tuned to complementary colors and thus emits a combined white light. The red sub-pixel can employ a red color filter and the green sub-pixel can employ a green color filter. Either the blue or yellow light-emitting areas can include a color filter, but preferably not both, so as to improve the luminous efficiency of the device. In this latter case, the blue emission from the blue light-emitting area meets the gamut requirements of the full-color LED device and effectively compensates for angular color changes in the yellow sub-pixel. While angular color changes are also found in the blue, applicants have determined that the shift of the blue sub-pixel to higher frequencies (i.e. bluer) is generally acceptable to viewers. Hence angular color compensation can be necessary for red, green, or yellow emitters, but not necessarily for blue emitters. If a white sub-pixel is employed, the blue sub-pixel can be primarily employed to improve the gamut of the device, while a primary color light-emitting area within the white-sub-pixel is used to compensate for color shifts in the complementary color light-emitting area. The primary and complementary colors of the white-light-emitting sub-pixel can include blue and yellow, red and cyan, or green and magenta.

Figure 6A:
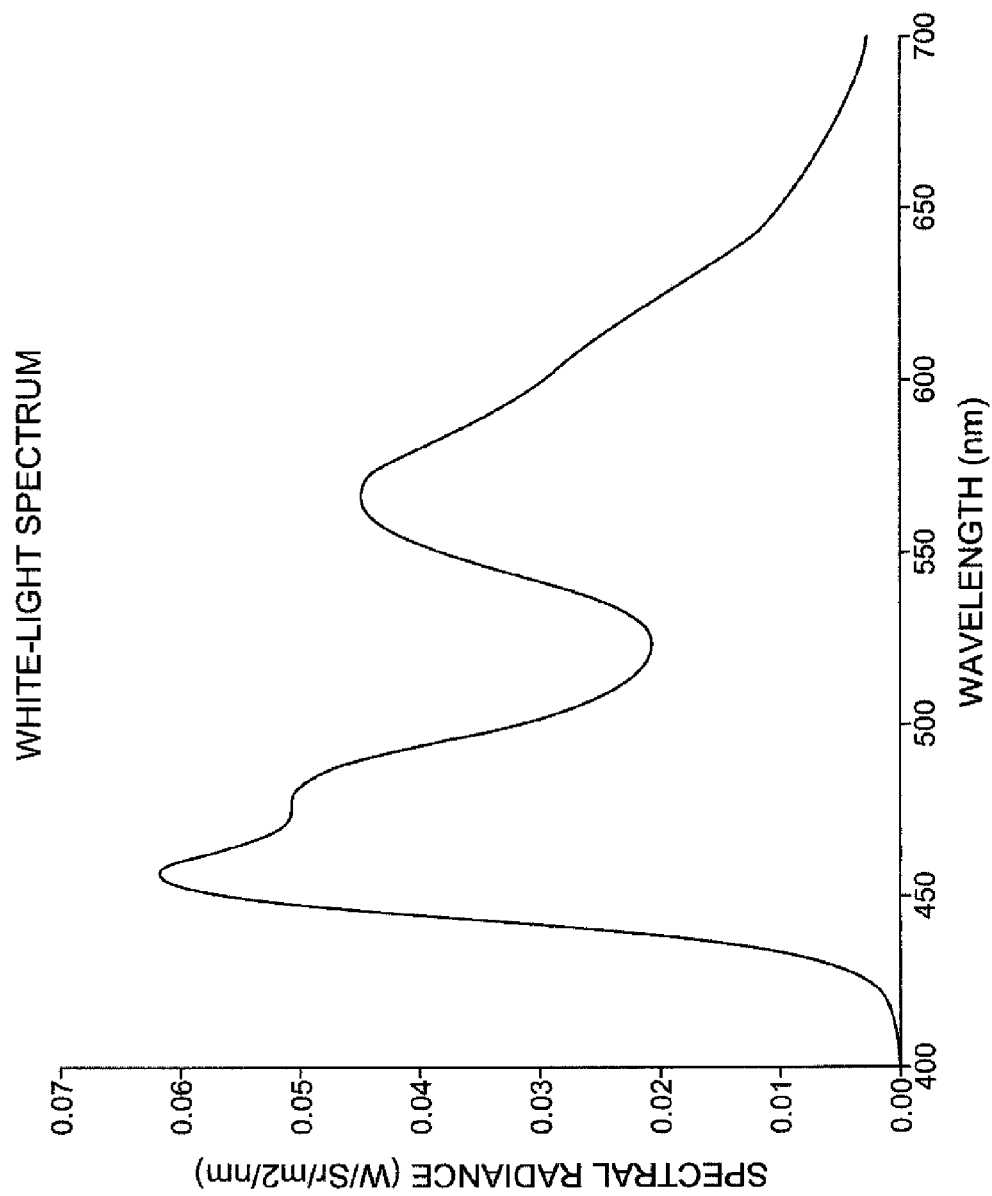
FIG. 6A is a graph illustrating the spectrum of a white emitter at a normal viewing angle without an optical cavity structure useful in various embodiments of the present invention.
Figure 6B:
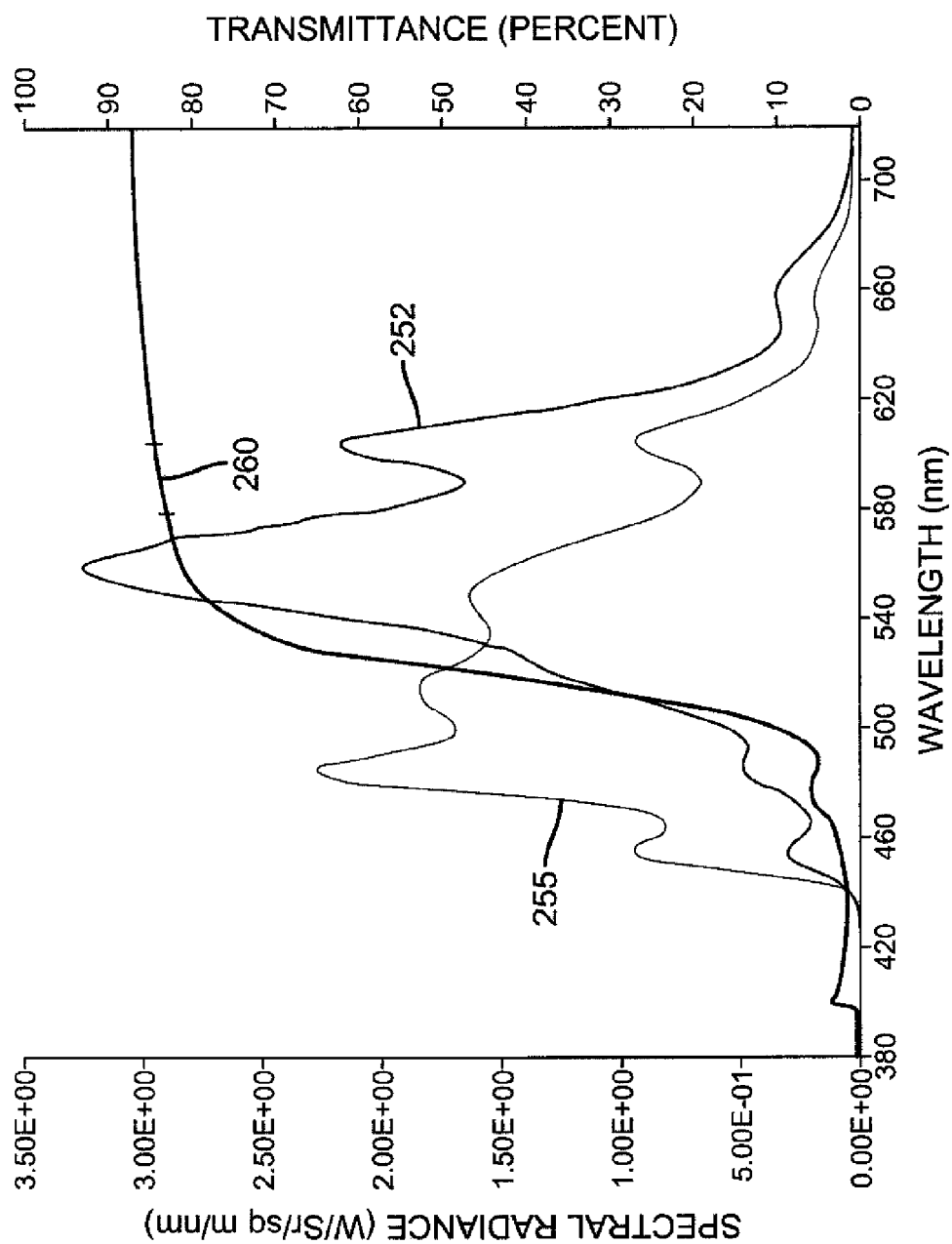
FIG. 6B is a graph illustrating the spectrum of a white emitter with an optical cavity at a normal viewing angle and at a different viewing angle together with the spectrum of a color filter useful in various embodiments of the present invention.
Figure 6C:
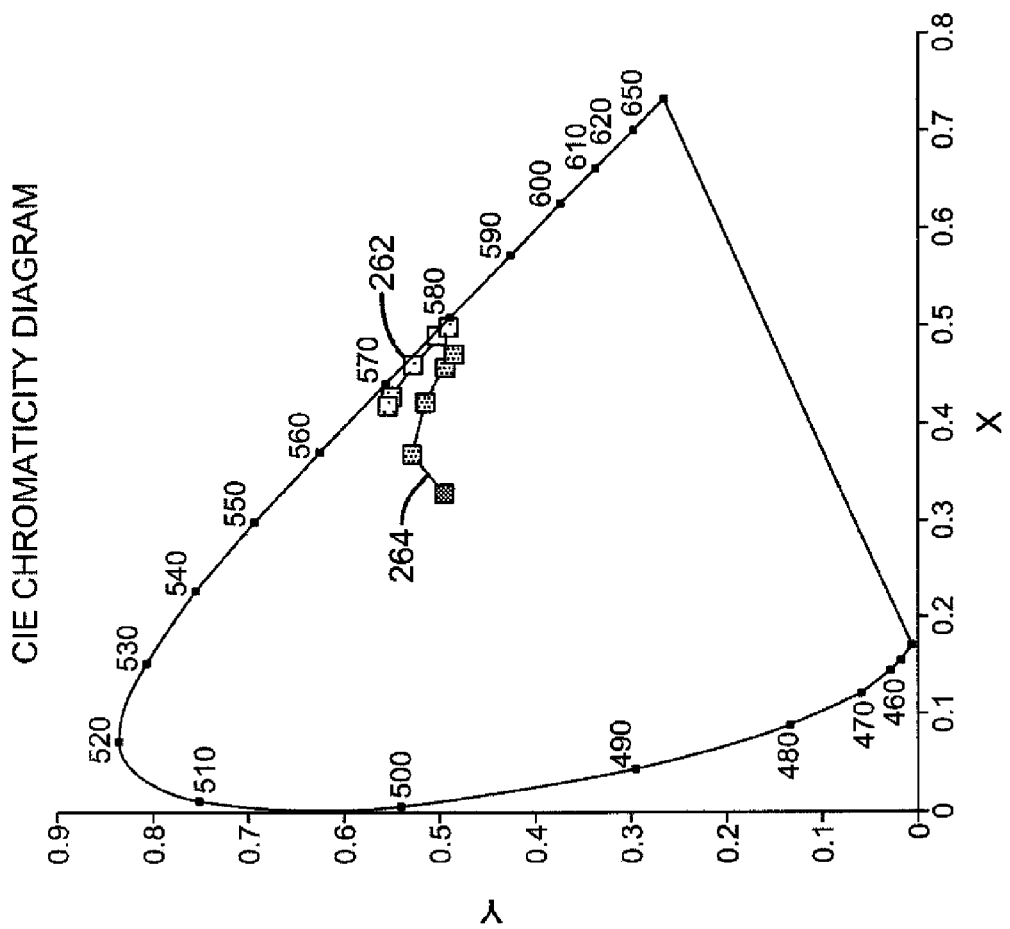
FIG. 6C is a graph illustrating the light emission wavelengths in CIE x and CIE y space of an embodiment of the present invention that incorporates a color filter.

Referring to FIG. 6A, a graph of the spectrum 250 of a white-light emitter, made by applicants, and useful for the present invention is illustrated. Referring to FIG. 6B, substantially yellow spectrum 252 is the light output from one optical cavity useful as the yellow sub-pixel. As the viewing angle increases, the emission frequency increases, shown by a shifted spectrum 255. By employing a color filter (e.g. a yellow color filter) with a low-pass spectrum 260 formed over the complementary sub-pixel 56, light can be preferentially transmitted through the color filter at a normal angle, with respect to the substrate, and preferentially absorbed by the color filter at an angle other than the normal. Hence, the color shift with viewing angle can be reduced without significantly reducing the amount of light emitted at a normal angle. Referring to FIG. 6C, the color shift with angle 264 for a white emitter in an optical cavity tuned for yellow emission without a color filter, is larger than the color shift with angle 262 for a white emitter in an optical cavity tuned for yellow emission with a color filter. The color filters (including those of the colored sub-pixels) will, however, reduce the luminance of the device at angles away from the normal. It should be noted, however, that the relative luminance efficiency as well as the chromaticity coordinate of the complementary sub-pixel can change as a function of viewing angle. In some such devices, using a yellow filter to reduce the change in luminance of the yellow sub-pixel as a function of viewing angle can be useful in maintaining a relatively constant luminance, because the luminance efficiency of the human eye increases as the peak in the yellow moves towards 550 nm.

Figure 7:
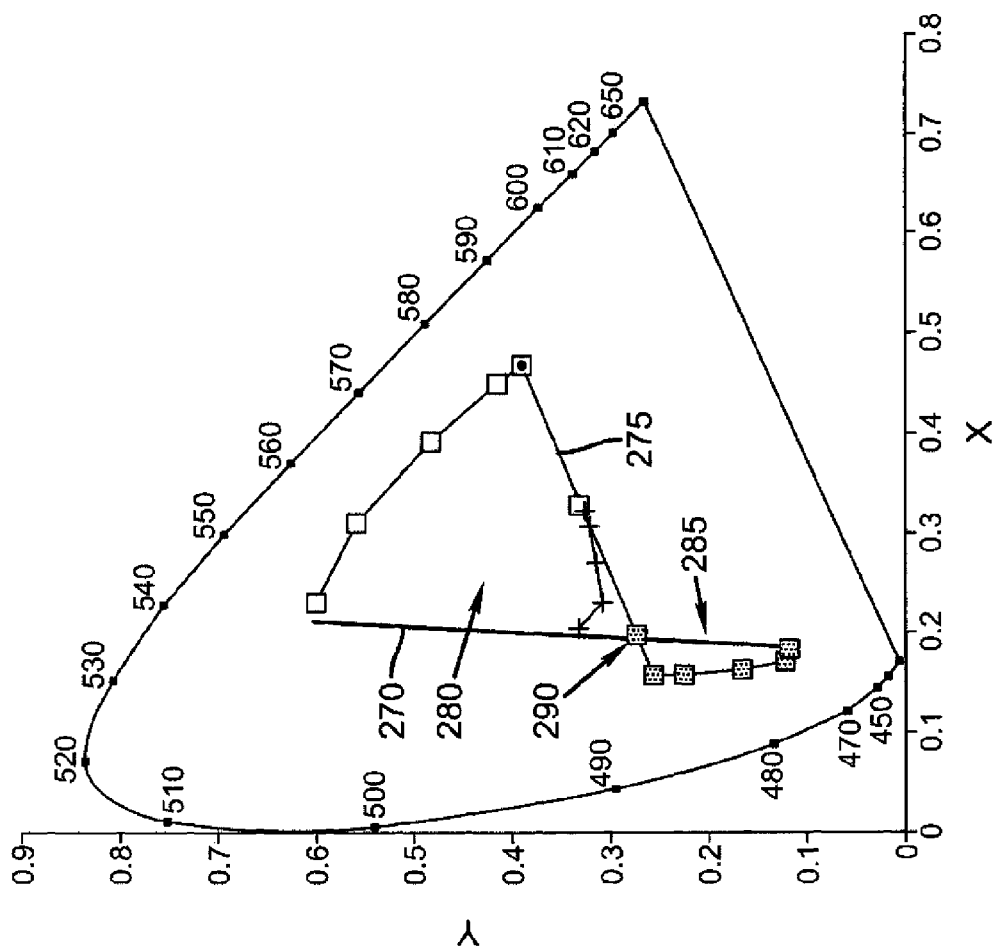
FIG. 7 is a graph illustrating various portions of FIG. 4.
Figure 8:
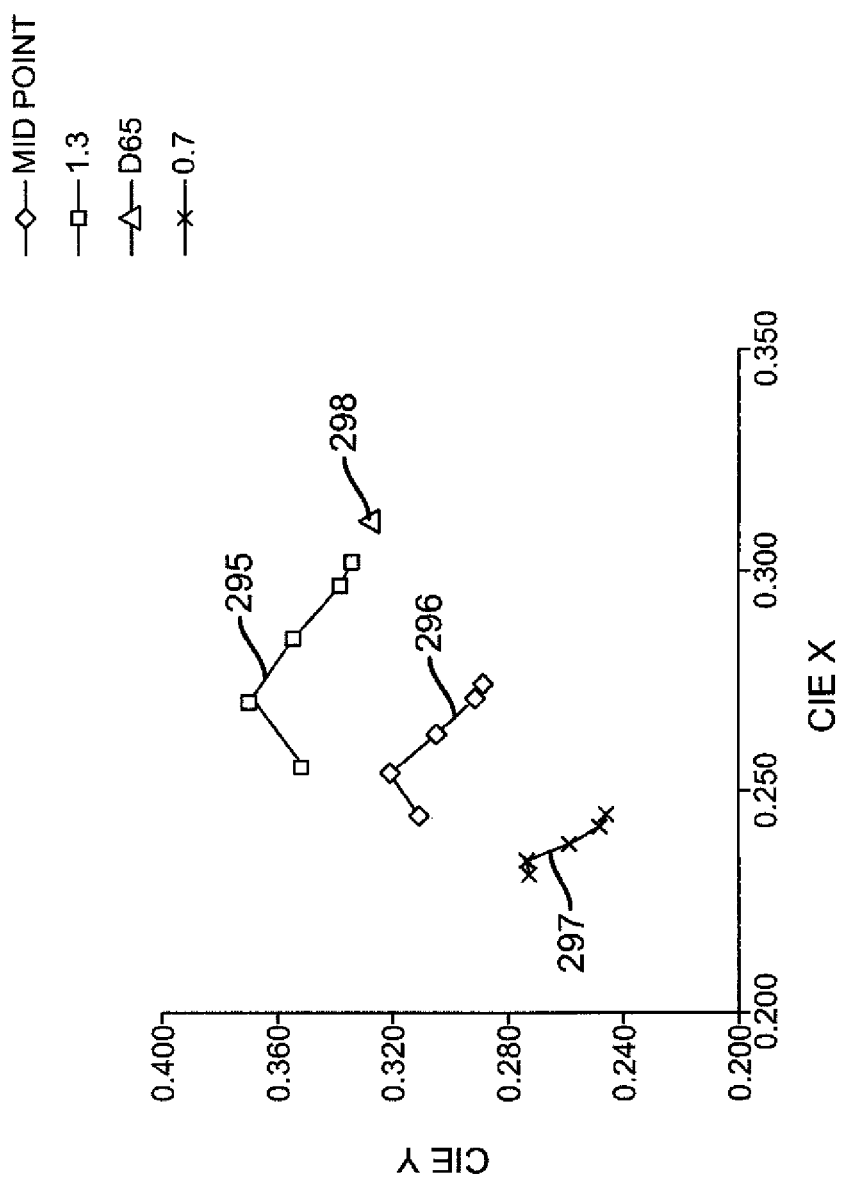
FIG. 8 is a graph illustrating the white point variation with viewing angle for a white sub-pixel with different relative sizes of the primary and complementary sub-pixels according to various embodiments of the present invention.
Figure 9:
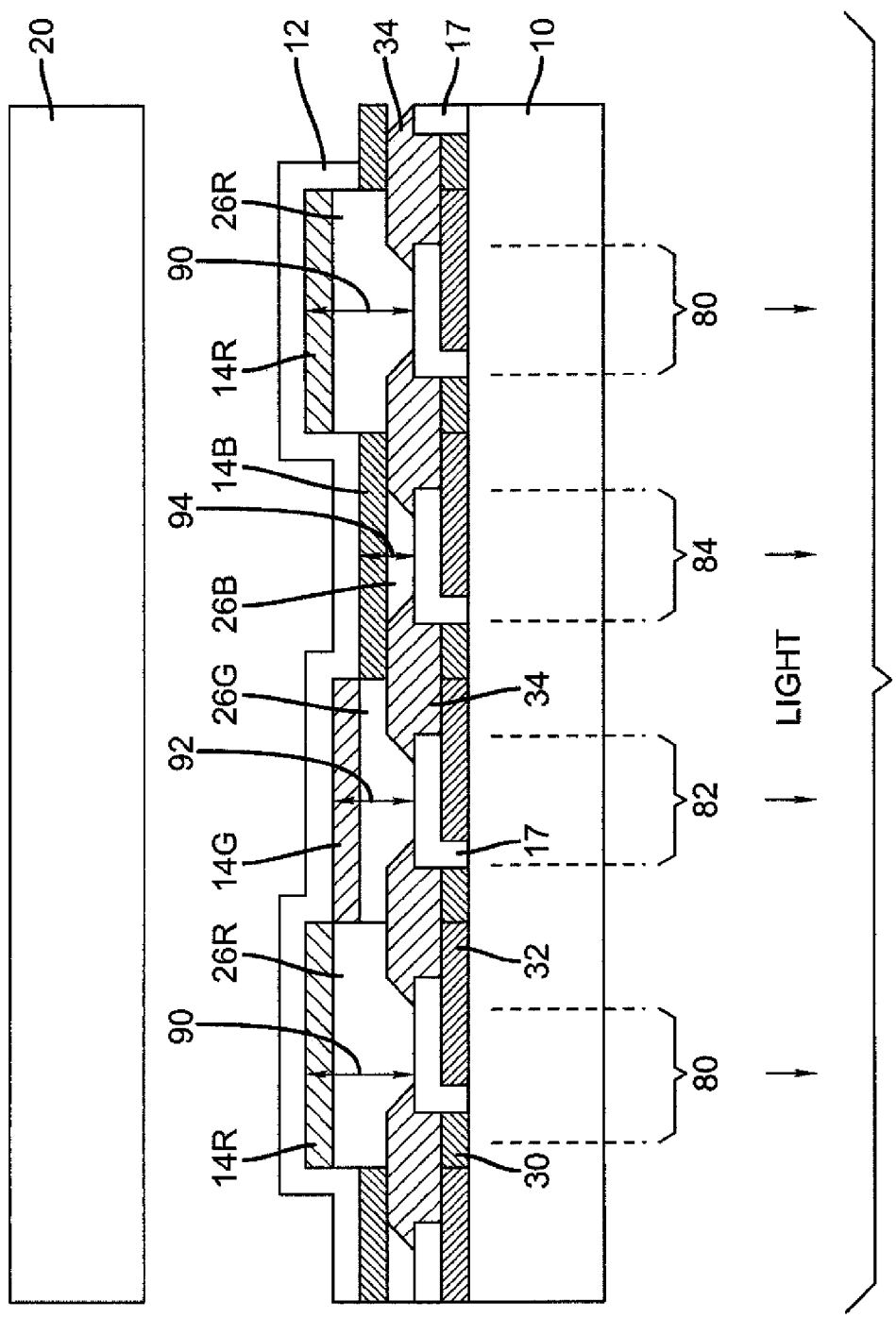
FIG. 9 illustrates a partial cross section of a prior-art bottom-emitter LED device.

The light emission from these devices can be further controlled by employing different luminance ratios for the primary light-emitting area and the complementary primary light-emitting area to achieve different device white points. As shown in FIG. 7, boundary lines 270 and 275 connecting the CIE x and y coordinates of blue and yellow emitters at the minimum and maximum angles of interest form areas 280 and 285 with a common intersection point at point 290. By changing the luminance ratio of the sub-pixels 54, 56, the relative positions of the white points can be moved closer to, or farther from, the intersection point 290. Hence, the amount of change in white point can be reduced as the white points move closer to the intersection point 290. Likewise, the amount of white-point change can be increased as the white points move further from the intersection point 290. Since, in typical organic light-emitting diode systems (OLEDs), yellow emitters are more efficient than blue, it can be advantageous to move the emitters toward the yellow emission points, even if the white points vary more, as long as the white-point variation is acceptable. Referring to FIG. 8, three curves are shown in a CIE x and y graph representing the white point variation from minimum viewing angle to maximum viewing angle for a white-light emitter (note: a different white-light emitter from that of FIG. 7). The relative areas of the yellow sub-pixel 56 vs. blue sub-pixels 54 are equal for curve 296, 1.3 for curve 295, and 0.7 for curve 297. A D65 white point is shown as point 298. The relative light emission and color shift shown in curve 295 is relatively greater than those of curves 296 or 297.

Matching the spectrum of the emissive material, the color filter peak transmissions, and the optical cavity response may increase the light emission from the optical cavities of the present invention. That is, the optical cavities of the colored sub-pixels are tuned to an approximate peak wavelength corresponding to the peak transmission wavelength of the corresponding color filter by changing the optical path length of the cavity. Likewise, the optical cavities of the white sub-pixels are tuned to one or more peak wavelengths approximately corresponding to the peak emission wavelengths of the white-light-emitting layer. Similarly, the peak emission wavelengths of the white-light-emitting layer are matched to the peak transmission wavelength of the corresponding color filter.

It may also be possible to design a system in which the normal, combined emission of the first and second sub-pixels is at a specific white point, such as D65. However, it is possible that the color change with viewing angle or average emission from a desired white point of such a design may be greater than an alternative design in which the emission stays closer to a desired white point or has a reduced change in white point with changing viewing angle, but never actually emits light at the desired white point. Such a design, in which the average performance is superior, may be desired. Average emission means the average white point for all of the viewing angles of interest, either weighted or unweighted by importance in an application. Hence, a preferred design may tune the emissions of a white sub-pixel to minimize the difference between the average emission of the white sub-pixel and a preferred device white-point at more than one angle, rather than to match a desired white point at a single viewing angle. Often, it is then possible to apply the red and green sub-pixels to adjust the white-point of the display (i.e., by adding the correct proportion of red and green light, the color of white emission can be moved towards the chromaticity of the yellow sub-pixel).

A variety of light-emissive materials can be employed. For example, the light-emitting layer 14 can comprise organic materials such as small-molecule organic or polymer materials or inorganic quantum dots formed in a poly-crystalline semiconductor matrix. Conventional photolithographic techniques can be employed to form control structures (e.g. busses, transistors, capacitors, electrodes) on a substrate as well as forming transparent layers suitable for defining optical cavities. Suitable cavity-defining transparent materials can include, for example, silicon dioxide or indium tin oxide, or organic materials. Organic materials can be deposited by various means known in the art, for example, vacuum evaporation. However, such means must provide sufficient precision and accuracy to enable the consistent manufacturing of the optical cavities. In particular, the Kodak Vapor Injection System™ is a linear, organic vacuum evaporation source providing deposition of organic layers to within 1% uniformity and accuracy that can be usefully employed. Encapsulation techniques for both organic and inorganic materials useful for the present invention are known in the art. The LED can be employed with various elements, such as circular polarizers (18 in FIG. 1), suitable for improving device ambient contrast ratio. In one embodiment, the LED is a top-emitter device, as shown in FIG. 1. In an alternative embodiment, (not shown) the LED is a bottom-emitter device.

Figure 10:
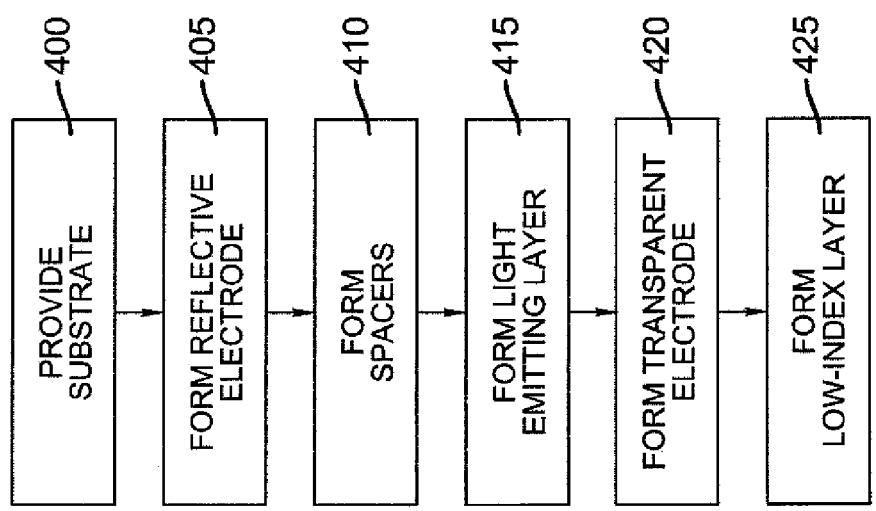
FIG. 10 is a flow diagram according to a method of the present invention.

Referring to FIG. 10, a method of making an LED device comprises the steps of: 400 providing a substrate, 405 forming a reflective electrode over the substrate and 410 forming optical spacers over the reflective electrode. The optical spacers can be electrically conductive. An unpatterned light-emitting layer is formed 415 over the reflective electrode. A transparent electrode can be formed 420 over the unpatterned light-emitting layer and a low-index layer (which can simply be an air gap comprising a layer of air, nitrogen, helium, argon or other gas or combination of gases) formed 425 over the transparent electrode so that the transparent electrode, the reflective electrode, the optical spacer, the low-index layer, and the unpatterned white-light-emitting layer form an optical cavity. Either the reflective or transparent electrode is patterned to form independently-controllable light-emitting sub-pixel elements. In further embodiments, the step of forming a reflective electrode includes the steps of first forming a reflective layer, and then forming an electrically conductive, optical spacer layer over the reflective layer. Alternatively, the step of forming a reflective electrode includes the steps of first forming a reflective layer, then forming an optical spacer layer over the reflective layer and then forming a transparent, conductive layer over the spacer layer. The steps of forming electrodes and spacer layers can be performed using conventional evaporative and photolithographic techniques, and can employ metals such as aluminum and silver, and oxides or nitrides such as silicon oxide, silicon nitride, and transparent conductive oxides such as indium tin oxide and aluminum doped zinc oxide.

Color filters can be formed over a side of the transparent electrodes, opposite the unpatterned light-emitting layer, in correspondence with some of the independently-controllable light-emitting elements to form colored sub-pixels. The color filters can be at least two different colors. At least one independently-controllable light-emitting element emits white light or light complementary to light emitted from a colored sub-pixel to form a complementary or white sub-pixel.

Through consumer research and optimization of white-light emitters, and with carefully selected optical cavity choices, applicants have demonstrated that the color change in white-light emitters using optical cavities of the present invention is acceptable to consumers. Such optical structures have manufacturing advantages, since neither the light-emitting layer nor the transparent electrode need be patterned. The LED herein provides improved light output, reduced angular color shift, and reduced costs when employing an unpatterned light-emitting layer, either organic or inorganic. Using actual white-light emitters and color filters made by applicant, the performance of an embodiment in at least one useful application can be summarized in Table 1:

TABLE 1

| Architecture | Ave. power (mW) | Peak power (mW) | NTSC xy ratio (%) | NTSC u'v' ratio (%) | Relative Luminance |
|---|---|---|---|---|---|
| Prior-art RGB | 505 | 2365 | 97.4 | 107.8 | 87% |
| Prior-art RGBW | 136 | 1769 | 97.4 | 107.8 | 86% |
| RGB invention | 341 | 1581 | 99.8 | 105.6 | 63% |
| RGBW invention | 109 | 1106 | 99.8 | 105.6 | 69% |

As can be understood from Table 1, LED has an improvement in power efficiency while maintaining a relatively constant color gamut. The relative luminance is defined as the luminance at 60 degrees divided by the luminance on-axis. It decreases more than for the prior art, but this is compensated for by the significant increase in power efficiency (calculated for a set of images at 500 nits). The relative luminance is an average of the relative luminance of the differently colored sub-pixels.

Figure 11:
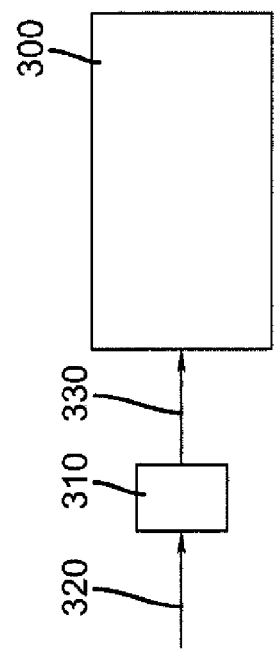
FIG. 11 is a system employing an LED device according to the present invention.

Referring to FIG. 11, an information-display system having an LED display device 300 (also shown in greater detail in FIGS. 1A and 1B). A controller 310 receives information signals 320 (e.g. text, and images), processes the signals to form a converted signal suitable for the display device 300, and drives the display 300 to display the converted signal 330.

Referring to FIG. 12, a method for controlling a light-emitting diode device according to one embodiment of the present invention, comprises the steps of forming 500 light-emitting areas having an optical structure, three of the sub-pixels emitting light of a primary color and that may have a color filter, and the fourth sub-pixel emitting white light or emitting a color complementary to one of the primary colors without a color filter, receiving 510 an RGB input signal, and converting 520 the input signal to a converted signal comprising at least four components. The four components include red, green, blue, and a color complementary to one of the red, green, or blue colors. The conversion step can include calculating the neutral component of the input signal and preferentially applying the complementary color and the corresponding primary color to form the neutral component of the input signal. The conversion step can also include preferentially applying the three primary colors when forming colors that are near the boundary defined by the chromaticity coordinates of the three primary colors. This preferential application can reduce the impact of angular color change on saturated colors similar to the complementary color. In one embodiment, the fourth sub-pixel emits yellow light and the complementary component is yellow. A preferential application of red and green to form yellow (the red and green sub-pixels having color filters to reduce angular color change), reduces the angular color change of the yellow emission. The converted signal can then be employed to drive 530 a device.

Referring to FIG. 13, light-emitting diode device is formed by selecting 600 primary and secondary (complementary) colored, light-emitting optical structures that when applied together provide a display white point having an acceptable change in chromaticity coordinates as a function of viewing angle. An array comprising a first primary colored optical structure and second complementary colored, light-emitting optical structure, together with at least one additional primary-colored, light-emitting optical structure can be formed 610 on a substrate. At least one additional primary colored, light-emitting optical structure includes a color filter and at least one of the first primary colored optical structures and the complementary colored, light-emitting optical structures does not include a color filter.

In a patterned device, different materials can be employed to emit light of different colors in response to a current. In contrast, in an unpatterned device, the same materials are employed to emit a single color, for example, white, and the light emitted by the color sub-pixels is colored by employing color filters and optical structures in combination with the white-light emitter. Often, a white-light emitter will include a combination of materials in one or more unpatterned layers that each emit a different color, for example, blue and yellow or red and cyan, to emit a light that is perceived, overall, to be white. The important point is that however many light-emitting materials are included in a single layer, or however many layers are included, the layers are unpatterned and their aggregate emission employed in all of the sub-pixels in all of the pixels. All of these layer combinations are included in the present invention and are considered a part of the light-emitting layer 14.

It is known in the prior art that, in LED devices, light may be trapped by total internal reflection in the high-optical-index layers that actually emit light, or high-optical index charge-control layers, or high-optical index transparent electrodes. Light emitted at low angles to the normal may be emitted from the device, while light emitted at a relatively higher angle to the normal may be trapped in the high-optical-index layers. By employing an optical cavity structure with Fresnel reflections, the emission of light at high angles is reduced so that more light is emitted from the device at relatively lower angles to the normal.

It is also true that the color of light emitted from optical cavity structures has a dependence on the viewing angle. This angular dependence can be extremely irritating to viewers, in particular for applications in which a large viewing angle is valued. This color shift with angle is especially noticeable for color sub-pixels using a white-light emitter. However, the color filters employed in the present invention for the color sub-pixels not only absorb ambient light, they also reduce the observed dependence on angle of the light color found with an optical cavity device. Such color filters, however, reduce device efficiency.

The color shift reduction found with increasing angle for the color sub-pixels with color filters provided by the present invention does reduce the luminance of these color sub-pixels at the increasing angles. Such a reduction in luminance is less noticeable and objectionable to viewers than a shift in color. Moreover, to the extent that the color sub-pixels decrease in luminance, while the luminance of the complementary sub-pixel is comparatively smaller (although a white-point shift may occur) as a result of changing viewing angle, the net effect may be a reduction in overall color saturation. Such a color saturation reduction may be negligible for some images (i.e. those images with little saturated color) and less noticeable than a change in color for those images with strongly saturated colors. Hence, improved image quality can be obtained. Moreover, since most images are relatively unsaturated, the net luminance effect may often be relatively minor.

LED devices of this invention can employ various well-known optical effects in order to enhance their properties, if desired. This includes optimizing layer thicknesses to yield maximum light transmission, providing dielectric mirror structures, providing anti-glare or anti-reflection coatings over the display, providing neutral density, or providing color conversion filters over the display. Filters, polarizers, and anti-glare or anti-reflection coatings can be specifically provided over or as part of the cover or substrate.

The present invention can be practiced with either active- or passive-matrix OLED devices, and is particularly useful in information-display devices. In one embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to VanSlyke et al. Inorganic devices, for example, employing quantum dots formed in a polycrystalline semiconductor matrix (for example, as taught in US Publication 2007/0057263 by Kahen), and employing organic or inorganic charge-control layers, or hybrid organic/inorganic devices can be employed. Many combinations and variations of organic or inorganic light-emitting displays can be used to fabricate such a device, including both active- and passive-matrix displays having either a top- or bottom-emitter architecture.

The invention has been described in detail with particular reference to certain preferred embodiments thereof, but it will be understood that variations and modifications can be effected within the spirit and scope of the invention.

PARTS LIST

| | |
|---|---|
| 10 | substrate |
| 11 | reflective layer |
| 12 | reflective electrode |
| 13, 13R, 13G, 13B, 13Y | spacer |
| 14 | light-emitting layer(s) |
| 14R, 14G, 14B | patterned light-emitting layers |
| 15 | transparent conductive layer |
| 16 | transparent electrode |
| 17 | semi-transparent electrode |
| 18 | circular polarizer |
| 19 | low-index layer |
| 20 | cover |
| 26 | spacers |
| 26R, 26G, 26B, 26Y | spacer |
| 30 | thin-film circuitry |
| 32 | insulator |
| 34 | insulator |
| 40 | color filters |
| 40R, 40G, 40B, 40Y | color filter |
| 40K | black matrix |
| 50, 52, 54, 56, 57 | sub-pixels |
| 60, 62, 64, 66, 66Y, 66B | optical path lengths |
| 80, 82, 84 | light |
| 200 | D65 white point |
| 205 | spectrum locus |
| 206 | purple boundary |
| 210 | CIE coordinates of blue emission curve |
| 215 | CIE coordinates of yellow emission curve |
| 220 | white point curve |
| 225 | white point at normal viewing angle |
| 230 | white point at maximum viewing angle |
| 250 | white emission spectrum |
| 252 | white optical cavity emission spectrum |
| 255 | shifted white optical cavity emission spectrum |
| 260 | color filter transmission spectrum |
| 262 | color shift with angle |
| 264 | color shift with angle |
| 270 | boundary line |
| 275 | boundary line |
| 280 | region |
| 285 | region |
| 290 | intersection |
| 295 | emission curve |
| 296 | emission curve |
| 297 | emission curve |
| 298 | D65 white point |
| 300 | device |
| 310 | controller |
| 320 | signal |
| 330 | converted signal |
| 400 | process step: provide substrate |
| 405 | process step: form electrode |
| 410 | process step: form optical spacers |
| 415 | process step: form unpatterned white-light-emitting layer |
| 420 | process step: form transparent electrode |
| 425 | process step: form low-index layer |
| 500 | process step: form sub-pixels |
| 510 | process step: receive input signal |
| 520 | process step: convert input signal |
| 530 | process step: drive device with converted signal |
| 600 | process step: select primary and secondary optical cavity structures |
| 610 | process step: form additional light-emitting optical cavity structure |

The invention claimed is:

1. A light-emitting diode device, comprising:
   a) a substrate;
   b) a reflective electrode formed over the substrate;
   c) an unpatterned light-emitting layer formed over the reflective electrode;
   d) a transparent electrode formed over the unpatterned light-emitting layer;
   e) one or more different optical spacers, defining at least two different optical path lengths, are formed in different locations over the substrate, between the reflective electrode and the transparent electrode; and
   f) a low-index layer formed over the transparent electrode, wherein the reflective or transparent electrode is patterned to form an independently controllable sub-pixel at two or more locations, and
   wherein each of the two or more locations of the sub-pixel emits complementary colors of light that combine to form a substantially white light.

2. The light-emitting diode device of claim 1, wherein:
   a combination of light emitted from the different locations of the different optical path lengths, is white; and
   a combined color change of the combined light emitted over a range of angles is less than a color change of the light emitted over the range of angles from at least one of the different locations.

3. The light-emitting diode device of claim 1, wherein the reflective or transparent electrode is patterned to form an independently controllable sub-pixel corresponding to each optical spacer.

4. The light-emitting diode device of claim 1, wherein the reflective or transparent electrode is patterned to form an independently controllable sub-pixel corresponding to two or more different locations having different optical spacers.

5. The light-emitting diode device of claim 1, further comprising one or more color filters located over at least one, but not all, of the different locations.

6. The light-emitting diode device of claim 1, wherein at least one optical spacer forms an optically constructive interference pattern at a frequency corresponding to a primary color frequency and at least one other optical spacer forms an optically constructive interference pattern at a frequency corresponding to a frequency of a color complementary to the primary color frequency.

7. The light-emitting diode device of claim 6, wherein the two different color complementary frequencies are blue and yellow or red and cyan.

8. The light-emitting diode device of claim 6, wherein the two or more different optical spacers form optically constructive interference patterns at two different wavelengths that differ by less than 150 nm.

9. The light-emitting diode device of claim 1, wherein the unpatterned light-emitting layer emits white light.

10. The light-emitting diode device of claim 9, wherein:
    the white light has a spectrum with frequency peaks; and
    at least one optical spacer forms an optically constructive interference pattern at a frequency corresponding to a spectral frequency peak of the white light.

11. The light-emitting diode device of claim 1, wherein the low-index layer has an optical index of less than 1.1.

12. The light-emitting diode device of claim 1, wherein:
    one location emits red light;
    a second location emits green light; and
    a third location emits blue light.

13. The light-emitting diode device of claim 12, further comprising a fourth location that emits yellow, cyan, or magenta light.

14. The light-emitting diode device of claim 1, wherein each of the two or more locations has at least two different optical spacers.

15. The light-emitting diode device of claim 1, wherein the low-index layer is an air-gap.

16. The light-emitting diode device of claim 1, wherein the complementary colors of light are red, yellow, and blue.

17. The light-emitting diode device of claim 1, wherein:
at least one location emits red light;
at least one location emits green light; at least one location emits blue light; and
at least one location emits white or colored light with a luminous efficiency higher than that of least one of the red, green, and blue locations.

18. A method of forming a light-emitting diode device, the method comprising:
a) providing a substrate;
b) forming a reflective electrode over the substrate;
c) forming an unpatterned light-emitting layer over the reflective electrode;
d) forming a transparent electrode over the unpatterned light-emitting layer;
e) forming one or more different optical spacers that define at least two different optical path lengths in different locations over the substrate, between and in contact with the reflective electrode and the transparent electrode; and
f) forming a low-index layer over the transparent electrode,
wherein the reflective or transparent electrode is patterned to form an independently controllable sub-pixel at two or more locations, and
wherein each of the two or more locations of the sub-pixel emits complementary colors of light that combine to form a substantially white light.

19. A display system, comprising:
a) an LED device having at least four, or more, differently colored sub-pixels, the LED device comprising:
i) a substrate;
ii) a reflective electrode formed over the substrate;
iii) an unpatterned light-emitting layer formed over the reflective electrode;
iv) a transparent electrode formed over the unpatterned light-emitting layer;
v) one or more different optical spacers, defining at least two different optical path lengths, are formed in different locations over the substrate, in contact with the reflective electrode and between the reflective electrode and the transparent electrode; and
vi) a low-index layer formed over the transparent electrode;
b) an input signal having three components; and
c) a controller for receiving the input signal, converting the input signal to a converted four-or-more component signal, and driving the LED device with the converted four-or-more component signal,
wherein the reflective or transparent electrode is patterned to form an independently controllable sub-pixel at two or more locations, and
wherein each of the two or more locations of the sub-pixel emits complementary colors of light that combine to form a substantially white light.

* * * * *